(12) United States Patent
Choi et al.

(10) Patent No.: US 10,924,062 B2
(45) Date of Patent: Feb. 16, 2021

(54) POWER AMPLIFYING APPARATUS HAVING BIAS BOOSTING STRUCTURE WITH IMPROVED LINEARITY

(71) Applicant: SAMSUNG ELECTRO-MECHANICS CO., LTD., Suwon-si (KR)

(72) Inventors: Kyu Jin Choi, Suwon-si (KR); Jae Hyouck Choi, Suwon-si (KR); Je Hee Cho, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 72 days.

(21) Appl. No.: 16/168,950

(22) Filed: Oct. 24, 2018

(65) Prior Publication Data

US 2019/0199291 A1 Jun. 27, 2019

(30) Foreign Application Priority Data

Dec. 27, 2017 (KR) ........................ 10-2017-0181052

(51) Int. Cl.
| | | |
|---|---|---|
| *H03F 3/04* | (2006.01) | |
| *H03F 1/02* | (2006.01) | |
| *H03F 3/189* | (2006.01) | |
| *H03F 3/21* | (2006.01) | |
| *H03F 3/24* | (2006.01) | |
| *H03F 1/32* | (2006.01) | |
| *H03F 3/191* | (2006.01) | |

(52) U.S. Cl.
CPC ......... *H03F 1/0205* (2013.01); *H03F 1/0272* (2013.01); *H03F 1/32* (2013.01); *H03F 3/189* (2013.01); *H03F 3/191* (2013.01); *H03F 3/21* (2013.01); *H03F 3/245* (2013.01); *H03F 2200/411* (2013.01); *H03F 2200/451* (2013.01)

(58) Field of Classification Search
CPC ... H03F 1/52; H03F 3/19; H03F 3/195; H03F 1/0272; H03F 3/245; H03F 2200/408; H03F 2200/18; H03F 2200/451; H03F 2200/444; H03F 2200/435
USPC ................................ 330/296, 285, 133, 310
See application file for complete search history.

(56) References Cited

U.S. PATENT DOCUMENTS

| | | | | |
|---|---|---|---|---|
| 6,762,647 B1 * | 7/2004 | Apel | ......................... | H03F 1/52 330/279 |
| 9,054,653 B2 * | 6/2015 | Gorbachov | ............... | H03F 1/34 |

FOREIGN PATENT DOCUMENTS

JP          7-22857 A         1/1995

OTHER PUBLICATIONS

Gu, Zeji, et al., "Enhanced Linearity and Efficiency of HBT MMIC Power Amplifiers for WCDMA Applications", *Proceedings of the 40th European Microwave Conference*, Sep. 2010, pp. 1002-1005 (4 pages in English).

* cited by examiner

*Primary Examiner* — Khanh V Nguyen
*Assistant Examiner* — Khiem D Nguyen
(74) *Attorney, Agent, or Firm* — NSIP Law

(57) ABSTRACT

A power amplifying apparatus includes a first bias circuit configured to generate a first bias current by adding a boost current to a base bias current generated from a reference current, a first amplification circuit configured to receive the first bias current and amplify a signal input through an input terminal of the first amplification unit to output a first amplified signal, and a bias boosting circuit configured to generate the boost current, based on a magnitude of a harmonic component in the amplified signal output from the first amplification circuit.

18 Claims, 4 Drawing Sheets

POWER AMPLIFYING APPARATUS HAVING BIAS BOOSTING STRUCTURE WITH IMPROVED LINEARITY

CROSS-REFERENCE TO RELATED APPLICATION(S)

This application claims the benefit under 35 U.S.C. § 119(a) of Korean Patent Application No. 10-2017-0181052 filed on Dec. 27, 2017 in the Korean Intellectual Property Office, the entire disclosure of which is incorporated herein by reference for all purposes.

BACKGROUND

1. Field

This application relates to a power amplifying apparatus that improves linearity by implementing a bias boosting structure.

2. Description of Related Art

As the demand for wireless communications systems to be broadband capable, multimedia capable, and smart gradually increases, the demand for broadband systems, improvements in linearity, and for a radio frequency (RF) power amplifier applied to the wireless communications system to be smart has increased.

Recently, linear operations in a higher power region has gradually become desirable for RF power amplifiers.

A typical two-stage power amplifying apparatus may include a drive amplification circuit for driving a large input capacitive loading of the power amplification circuit, and a power amplification circuit for obtaining high output power. Typically, when an operation in which input power is high and an operation in which the input power is low are compared with each other, a bias point of the amplification circuit may be different in the respective cases, and as the input power increases, the bias point decreases due to non-linearity of a transistor of the amplification circuit.

Such a decrease of the bias point may be additionally and automatically compensated for by a direct current (DC) component caused by non-linearity of an active bias circuit.

However, in the typical two-stage power amplifying apparatus, it may not be necessary to compensate for the power amplification circuit having high input power, but since the drive amplification circuit driven with relatively low input power has the bias point which is decreased as the input power increases, the linearity of a system may deteriorate. In particular, the drive amplification circuit driven with a low bias point in a high-power region may adversely affect the entire linearity of the system.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In a general aspect, a power amplifying apparatus includes a first bias circuit configured to generate a first bias current by adding a boost current to a base bias current generated from a reference current, a first amplification circuit configured to receive the first bias current and amplify a signal input through an input terminal of the first amplification unit to output a first amplified signal, and a bias boosting circuit configured to generate the boost current, based on a magnitude of a harmonic component in the amplified signal output from the first amplification circuit.

The bias boosting circuit may be configured to convert the harmonic component in the amplified signal output from the first amplification circuit into a direct current (DC) current, and generate the boost current based on a magnitude of the DC current.

The bias boosting circuit may include a harmonic extraction circuit configured to extract the harmonic component from the amplified signal output from the first amplification circuit, a rectifier circuit configured to rectify the extracted harmonic component, a low pass filter configured to generate a DC current by low-passing a signal rectified by the rectifier circuit and output the DC current, and a boost circuit configured to boost the DC current output from the low pass filter and provide the boost current to the first bias circuit.

The harmonic extraction circuit may include an LC parallel resonance circuit that forms a parallel resonance point in a fundamental frequency component of the amplified signal output from the first amplification circuit to block a fundamental frequency component and pass harmonic components other than the fundamental frequency component to the rectifier circuit.

The rectifier circuit may include a diode-connected transistor configured to perform full-wave rectification of the harmonic component when a magnitude of the harmonic component extracted by the harmonic extraction circuit is equal to or greater than a magnitude of a turn-on voltage.

The low pass filter may include a resistor having one terminal connected to an output terminal of the rectifier circuit, and a capacitor connected between the other terminal of the resistor and a ground.

The boost circuit may include a current boost transistor having a collector connected to a battery voltage, a base input with a DC current from the low pass filter, and an emitter boosting and outputting the DC current.

In a general aspect, a power amplifying apparatus includes a first bias circuit configured to generate a first bias current by adding a boost current to a base bias current generated from a reference current, a first amplification circuit configured to receive the first bias current and amplify a signal input through an input terminal of the first amplification unit to output a first amplified signal, a second bias circuit configured to generate a second bias current, a second amplification circuit configured to receive the second bias current and amplify the first amplified signal received from the first amplification circuit, and a bias boosting circuit configured to generate the boost current, based on a magnitude of a harmonic component in the amplified signal output from the first amplification circuit and provide the boost current to the first bias circuit.

The bias boosting circuit may be configured to convert the harmonic component in the amplified signal output from the first amplification circuit into a direct current (DC) current, and generate the boost current, based on a magnitude of the DC current.

The bias boosting circuit may include a harmonic extraction circuit configured to extract the harmonic component from the amplified signal output from the first amplification circuit, a rectifier circuit configured to rectify the extracted harmonic component, a low pass filter configured to generate a DC current by low-passing a signal rectified by the rectifier circuit, and a boost circuit configured to boost the DC current output from the low pass filter and provide the boost current to the first bias circuit.

The harmonic extraction circuit may include an LC parallel resonance circuit that forms a parallel resonance point in a fundamental frequency component of the amplified signal output from the first amplification circuit to block a fundamental frequency component and pass harmonic components other than the fundamental frequency component to the rectifier circuit.

The rectifier circuit may include a diode-connected transistor configured to perform full-wave rectification of the harmonic component when a magnitude of the harmonic component extracted by the harmonic extraction circuit is equal to or greater than a turn-on voltage.

The low pass filter may include a resistor having one terminal connected to an output terminal of the rectifier circuit, and a capacitor connected between the other terminal of the resistor and a ground.

The boost circuit may include a current boost transistor having a collector connected to a battery voltage, a base input with a DC current from the low pass filter, and an emitter boosting and outputting the DC current.

In a general aspect, a power amplifying apparatus includes a bias circuit configured to generate a first bias current by adding a boost current to a base bias current, an amplification circuit configured to receive the first bias current, amplify an input signal, and output an amplified signal, a bias boosting circuit that includes a harmonic extraction circuit configured to extract a harmonic component from the outputted amplified signal, a rectifier circuit configured to rectify the extracted harmonic component, a low pass filter configured to generate a direct current (DC) current by low-passing the rectified signal, and a boost circuit configured to generate the boost current based on a magnitude of the DC current and provide the generated boost signal to the first bias circuit.

The base bias current may be generated from a reference current.

The rectifier circuit may include a diode-connected transistor configured to perform full-wave rectification of the harmonic component when a magnitude of the harmonic component extracted by the harmonic extraction circuit is equal to or greater than a magnitude of a turn-on voltage.

The boost circuit may include a current boost transistor having a collector connected to a battery voltage, a base input with a DC current from the low pass filter, and an emitter boosting and outputting the DC current.

Other features and aspects will be apparent from the following detailed description, the drawings, and the claims.

BRIEF DESCRIPTION OF THE DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
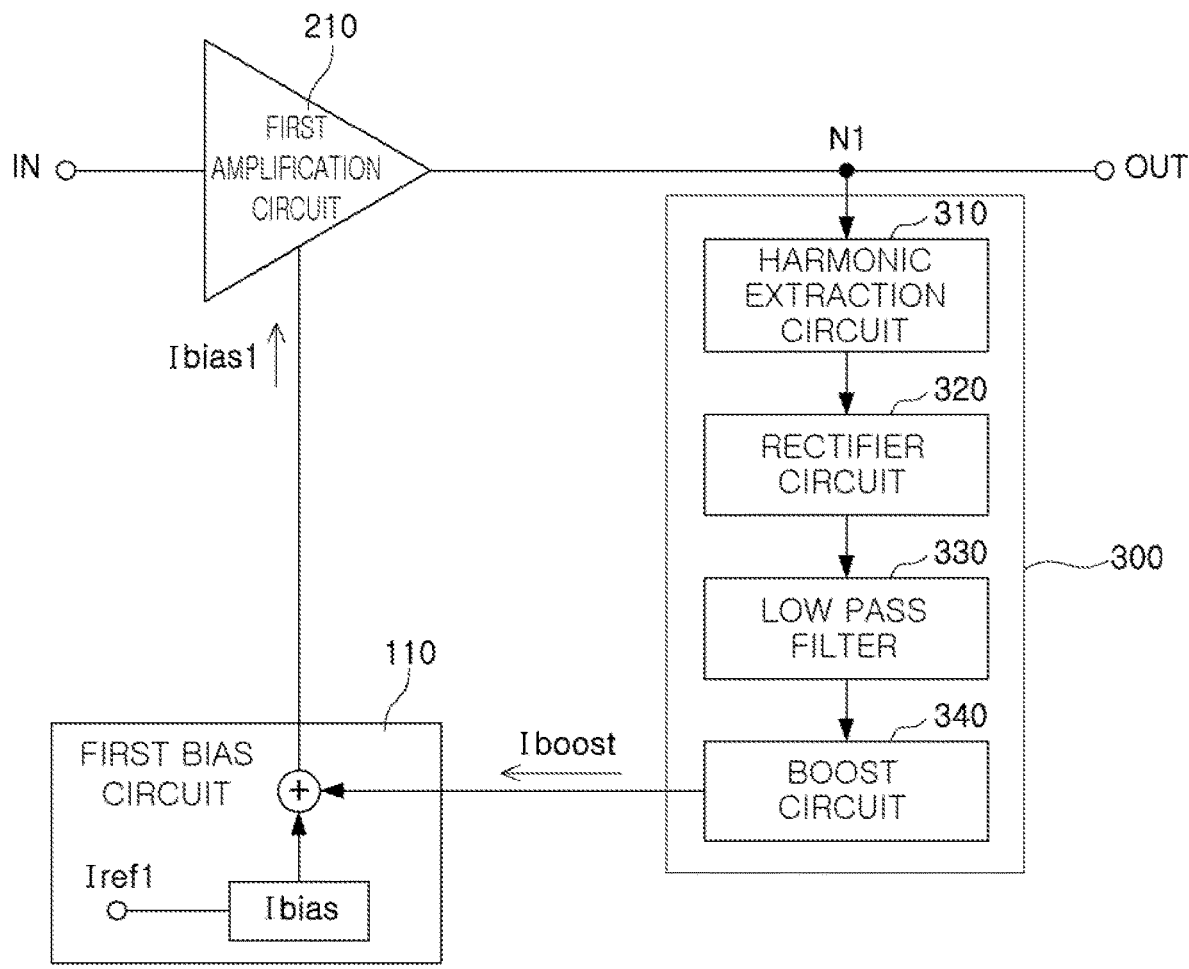
FIG. 1 is a view illustrating an example of a configuration of a power amplifying apparatus.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure.

The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

FIG. 1 is a view illustrating an example of a configuration of a power amplifying apparatus.

Referring to FIG. 1, a power amplifying apparatus may include a first bias circuit 110, a first amplification circuit 210, and a bias boosting circuit 300. The bias boosting circuit 300 may include a harmonic extraction circuit 310 that extracts an alternating current (AC) component, for example, a harmonic component, from a signal output from the first amplification circuit 210, a rectifier circuit 320 that rectifies the extracted harmonic component, a low pass filter 330 that generates a direct current (DC) by low-passing the signal rectified by the rectifier circuit 320, and a boost circuit 340 that boosts the generated DC output from the low pass filter 330, and provides the generated boost current (Iboost) to the first bias circuit 110.

Figure 2:
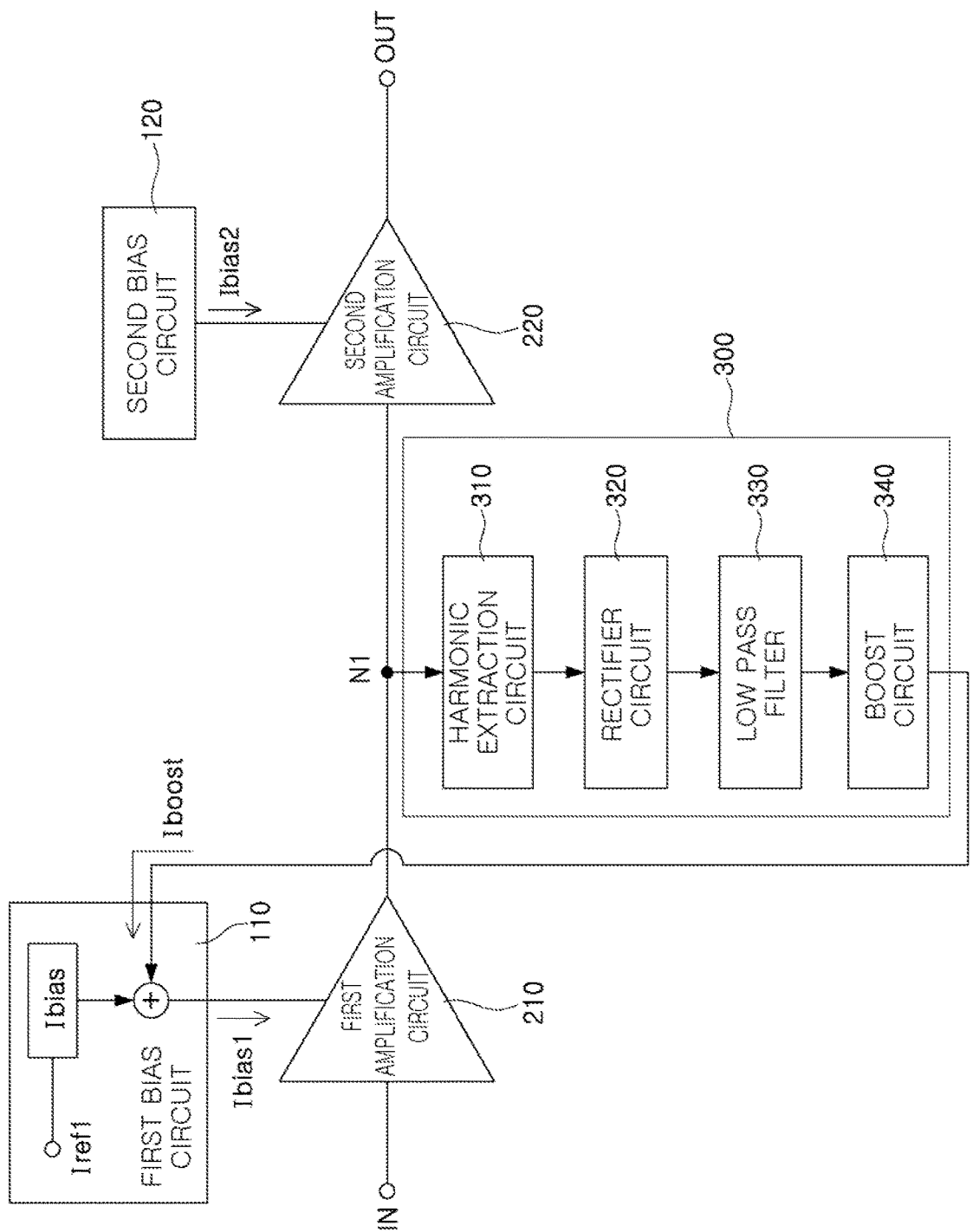
FIG. 2 is a view illustrating an example of a configuration a power amplifying apparatus.

FIG. 2 is a view illustrating an example of a configuration of a power amplifying apparatus.

Referring to FIG. 2, a power amplifying apparatus may include a first bias circuit 110, a first amplification circuit 210, a second bias circuit 120, a second amplification circuit 220, and the bias boosting circuit 300. As a non-limiting example, the first bias circuit 110, the first amplification circuit 210, and the bias boosting circuit 300 of FIG. 1 may correspond to the first bias circuit 110, the first amplification circuit 210, and the bias boosting circuit 300 of FIG. 2.

It is noted that use of the term "may" herein with respect to an example or embodiment, e.g., as to what an example or embodiment may include or implement, means that at least one example or embodiment exists where such a feature is included or implemented while all examples and embodiments are not limited thereto.

Referring to FIGS. 1 and 2, the first bias circuit 110 may generate a first bias current Ibias1 based on a bias current Ibias generated based on a first reference current Iref1 and a boost current Iboost.

The first amplification circuit 210 may be supplied with the first bias current Ibias1 and may amplify a signal input through an input terminal IN to output a first amplified signal.

The second bias circuit 120 may generate a second bias current Ibias2 based on a bias current generated based on a second reference current Iref2 and a boost current.

The second amplification circuit 220 may be supplied with the second bias current Ibias2 and amplify a signal input from the first amplification circuit 210 to output a second amplified signal.

In a two-stage power amplifying apparatus that includes the first amplification circuit 210 and the second amplification circuit 220, since the second amplification circuit 220 may be driven with relatively high input power and may operate as an active bias circuit, a decreased bias point thereof may be autonomously boosted, but the bias point of the first amplification circuit 210 driven with relatively low input power may be decreased as the input power increases.

In particular, since the first amplification circuit 210 driven with a low bias point in a high power region adversely affects the entire linearity of a system, it is desirable to compensate for the adverse effect on the linearity on the system by compensating for the decrease of the first bias point of the first amplification circuit 210.

As an example, upon a high-power operation of the first amplification circuit 210, in a case in which a boost current is additionally supplied to a base bias current of the first amplification circuit 210 based on an alternating current (AC) current of an output terminal, since the AC current of the output terminal is not sorted for each of the frequency components, most of the current component may be a fundamental component. As a result, in a case in which a fundamental current is extracted and used, an input current for driving the second amplification circuit (e.g., the power amplification circuit) in the first amplification circuit (e.g., the drive amplification circuit) may be decreased, and a gain degradation is thus caused. Since a level of initial input power should be largely used to obtain the same output power, efficiency may be degraded due to an increase of a consumed DC current.

Accordingly, in an example, an operation of extracting the remaining AC component, for example, the harmonic component, except for the fundamental component and compensating the bias point based on a magnitude of the harmonic component is described.

The bias boosting circuit 300 may generate the boost current Iboost based on a magnitude of a harmonic component in the signal output from the first amplification circuit 210 and provide the boost current Iboost to the first bias circuit 110.

In addition, the first bias circuit 110 may add the received boost current Iboost to the bias current generated based on the first reference current Iref1 to generate the first bias current Ibias1 or a boosted current bias Ibias1. The bias boosting circuit 300 that generates the boost current Iboost will be described with reference to FIG. 3.

In the respective figures, unnecessarily overlapped descriptions may be omitted for components having the same reference numeral and the same function, and differences in the respective drawings will mainly be described.

Figure 3:
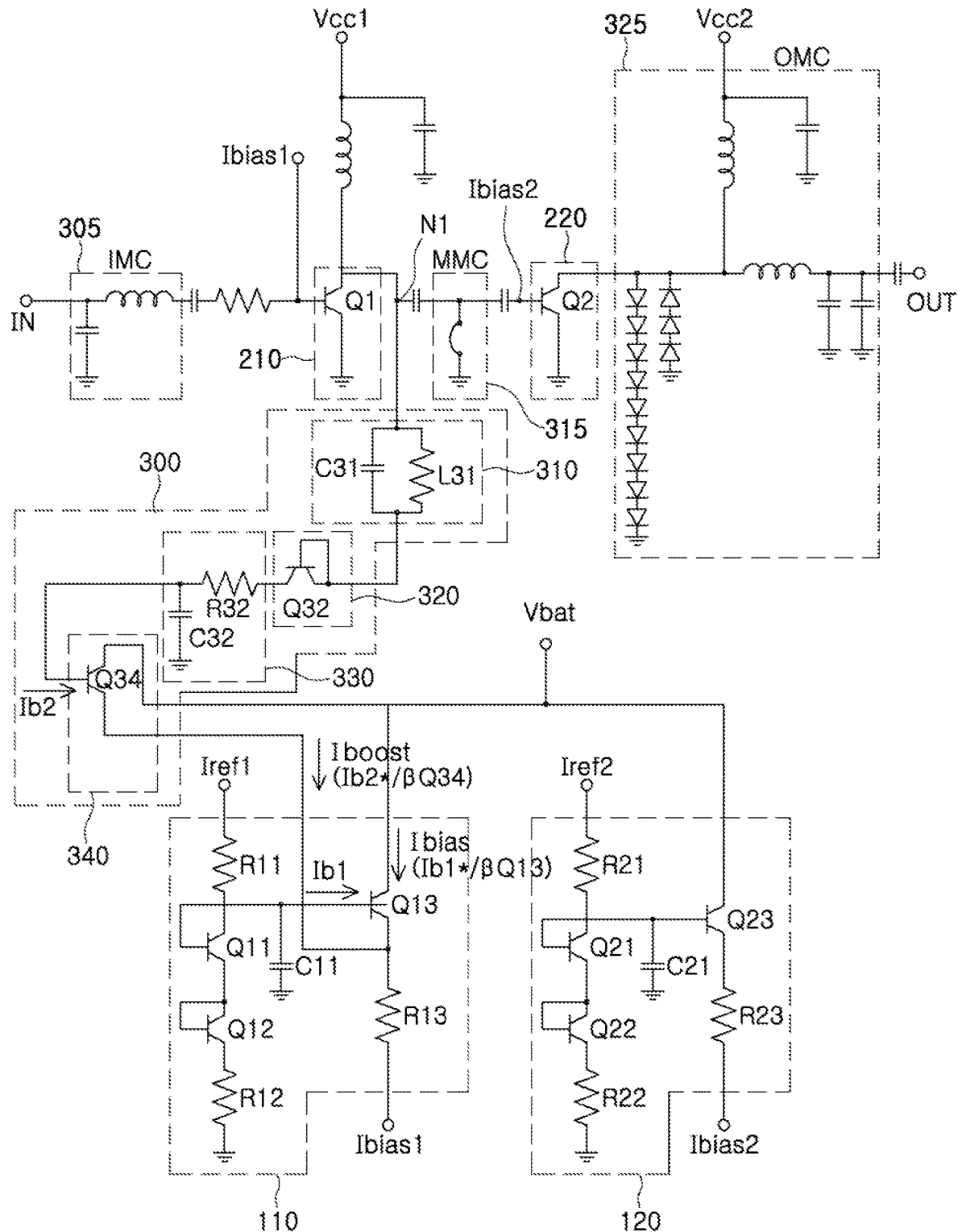
FIG. 3 is a view illustrating an example of a circuit configuration of the power amplifying apparatus of FIG. 2.

FIG. 3 is a view illustrating an example of a circuit configuration of the power amplifying apparatus of FIG. 2.

Referring to FIG. 3, a circuit configuration example of each of the first amplification circuit 210, the second amplification circuit 220, the first bias circuit 110, the second bias circuit 120, and the bias boosting circuit 300 will be described.

The first amplification circuit 210 may include a plurality of first amplification transistors Q1 having a base to which a first bias current Ibias1 is supplied. The second amplification circuit 220 may include a plurality of second amplification transistors Q2 having a base to which a second bias current Ibias2 is supplied.

In addition, the power amplification circuit may include an input matching circuit (IMC) 305, an inter-stage matching circuit (MMC) 315, and an output matching circuit (OMC) 325.

The input matching circuit (IMC) 305 may include an inductor and a resistor.

The inter-stage matching circuit (MMC) 315 may include a wire inductor.

The output matching circuit (OMC) 325 may include an inductor, a capacitor, and a diode circuit for discharge protection which is reversely connected.

As an example, a DC blocking capacitor may be connected between the above-mentioned circuits.

As an example, each of the first amplification transistor Q1 and the second amplification transistor Q2 may be a hetero-junction bipolar transistor (HBT), but is not limited thereto.

As an example, the first bias circuit 110 may include a resistor R11, transistors Q11 and Q12 connected to each other by a diode, and a resistor R12, which are connected in series with each other between a first reference current Iref1 terminal and a ground. The first bias circuit 110 may include an output transistor Q13 having a collector connected to a battery voltage Vbat terminal, a base connected to a connection node of the resistor R11 and the transistor Q11 connected by the diode, and an emitter connected to an output terminal through the resistor R13. A current Ib1 determined by the first reference current Iref1, the resistor R11, and the transistors Q11 and Q12 may be amplified by the output transistor Q13, and an amplified bias current (Ibias=Ib1*βQ13, where βQ13 is a current gain of Q13) may flow through the resistor R13 of an output side of the first bias circuit 110.

The first bias circuit 110 may further include a capacitor C11 connected to the base of the output transistor Q13. The first bias circuit 110 illustrated in FIG. 3 is merely illustrated as an example and is not limited thereto.

As an example, the second bias circuit 120 may include a resistor R21, transistors Q21 and Q22 connected to each other by a diode, and a resistor R22, which are connected in series with each other between a second reference current Iref2 terminal and a ground. The second bias circuit 120 may include an output transistor Q23 having a collector connected to a battery voltage Vbat terminal, a base connected to a connection node of the resistor R21 and the transistor Q21 connected by the diode, and an emitter connected to an output terminal through the resistor R23. The second bias circuit 120 may further include a capacitor C21 connected to the base of the output transistor Q23. The second bias circuit 120 illustrated in FIG. 3 is merely illustrated as an example and is not limited thereto.

The bias boosting circuit 300 may convert the harmonic component in the signal output from the first amplification circuit 210 into a DC current, and generate the boost current Iboost based on a magnitude of the DC current.

Referring to FIG. 3, for example, the bias boosting circuit 300 may include a harmonic extraction circuit 310, a rectifier circuit 320, a low pass filter 330, and a boost circuit 340.

The harmonic extraction circuit 310 may extract a harmonic component from the signal output from the first amplification circuit 210. As an example, the harmonic extraction circuit 310 may include an LC parallel resonance circuit. The LC parallel resonance circuit may form a parallel resonance point in a fundamental frequency component fo of the signal output from the first amplification circuit 210. In this case, the LC parallel resonance circuit may have infinite impedance for the fundamental frequency component fo. The fundamental frequency component is not passed but blocked by the LC parallel resonance circuit, and harmonic components 2fo and 3fo other than the fundamental frequency component fo may be passed to the rectifier circuit 320. By the harmonic extraction circuit 310, the fundamental frequency component fo may be conducted to the second amplification circuit, and the harmonic components 2fo and 3fo other than the fundamental frequency component fo may be conducted to the rectifier circuit 320.

The rectifier circuit 320 may rectify the harmonic component extracted by the harmonic extraction circuit 310. As an example, the rectifier circuit 320 may include a diode-connected transistor Q32. In a case in which a magnitude of the harmonic component extracted by the harmonic extraction circuit 310 is greater than or equal to a magnitude of a turn-on voltage, the rectifier circuit 320 may perform full-wave rectification of the harmonic component. That is, the diode-connected transistor Q32 may have a base and a collector which are connected by a diode to form a PN junction diode, and in a case in which an average value of an AC voltage swing of an output terminal of the first amplification circuit 210 is equal to a turn-on voltage or more, the average value of the AC voltage swing may be rectified only in a high power section in which the diode-connected transistor Q32 is turned-on and may be conducted to the low pass filter 330, and a rectification operation may not be performed in an output power section which is the turn-on voltage or less.

The low pass filter 330 may generate a DC current by low-passing the signal rectified by the rectifier circuit 320. As an example, the low pass filter 330 may include a resistor R32 having one terminal connected to an output terminal of the rectifier circuit 320 and a capacitor C32 connected between the other terminal of the resistor R32 and a ground. In this case, the low pass filter LPF 330 including the resistor R32 and the capacitor C32 may make a band width BW of 3 dB very small so that the component output from the low pass filter LPF 330 is almost a direct current DC.

In addition, the boost circuit 340 may boost the DC current output from the low pass filter 330 and provide the boost current Iboost to the first bias circuit 110. As an example, the boost circuit 340 may include a current boost transistor Q34 having a collector connected to the battery voltage Vbat, a base input with the DC current from the low pass filter 330, and an emitter boosting and outputting the DC current.

For example, the DC current Ib2 passing through the low pass filter LPF 330 may be applied to the base of the current boost transistor Q34 of the boost circuit 340, and the boost current (Iboost=Ib2*βQ34, where βQ34 is a current gain of Q34) of the DC current amplified at the emitter of the current boost transistor Q34 may flow through the resistor R13 of an output side of the first bias circuit 110. As a result, the boost current Iboost and the bias current Ibias may be added to each other through the resistor R13 of the output side of the first bias circuit to generate a first bias current Ibias1, which may be supplied to the base of the first amplification circuit 210.

As described above, when the power amplifier apparatus is driven with relatively high input power, the boost circuit 340 may operate in a region in which the bias point of the first amplification circuit 210 decreases.

Accordingly, when the boost circuit 340 operates, the boost current (Iboost=Ibias+Iboost) may be added to the bias current Ibias to determine the first bias current Ibias1. On the other hand, when the boost circuit 340 does not operate, since the boost current is not added, the bias current Ibias may be determined to be the first bias current (Ibias1==Ibias).

Figure 4:
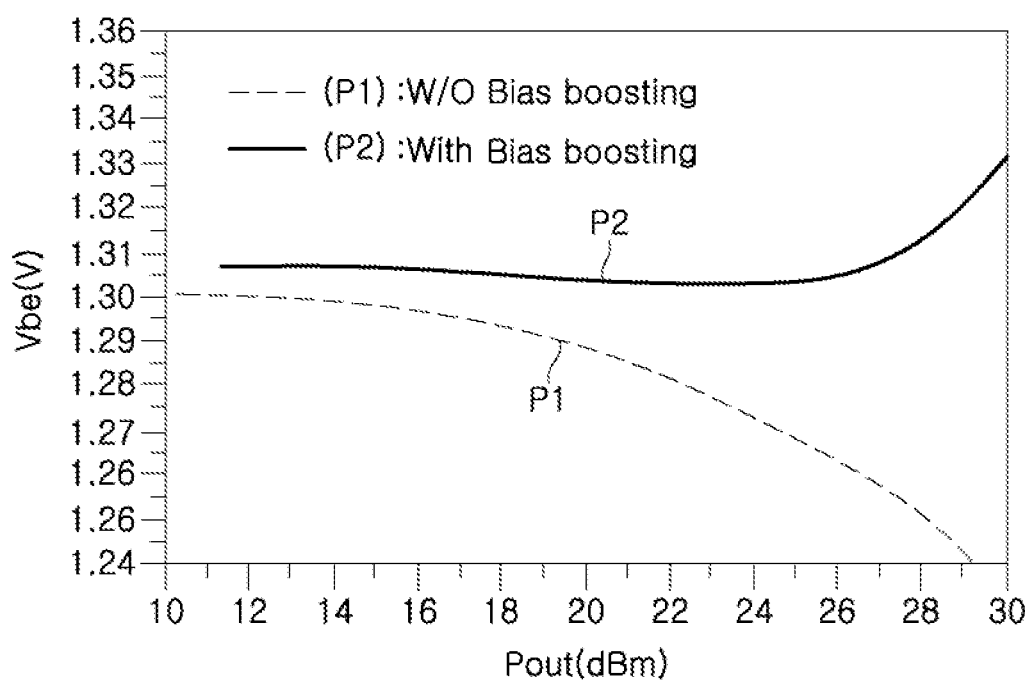
FIG. 4 illustrates an example of a characteristic graph of Vbe-Pout depending on whether or not a bias boosting is used.

FIG. 4 is a characteristic graph of Vbe-Pout depending on whether or not a bias boosting is used.

In FIG. 4, P1 is a graph illustrating a relationship between a base-emitter voltage Vbe, which is the bias voltage of the first amplification circuit and output power Pout of the first amplification circuit for a case in which the bias boosting is not used, and P2 is a graph illustrating a relationship between the base-emitter voltage Vbe, which is the bias voltage of the first amplification circuit and the output power Pout of the first amplification circuit for a case in which the bias boosting is used. That is, P1 and P2 are graphs of results obtained by simulating the base-emitter voltage Vbe, which is the DC voltage of the base terminal of the first amplification circuit while increasing input power of the first amplification circuit.

Referring to P1 of FIG. 4, in a case in which the bias boosting is not used, it may be seen that as the output power Pout increases, the base-emitter voltage Vbe decreases. On the other hand, referring to P2, in a case in which the bias boosting is used, it may be seen that even if the output power Pout increases, the base-emitter voltage Vbe of the first amplification circuit is maintained to be flat without being decreased.

As set forth above, according to an example, by additionally supplying a boosted current generated based on a magnitude of a harmonic component other than a fundamental frequency component in a signal output from an amplification circuit to a base bias of the amplification circuit, bias magnitude may be maintained at an appropriate level even in a case in which power of the output signal increases, and as a result, linearity of the amplification circuit may be improved.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A power amplifying apparatus comprising:
a first bias circuit configured to generate a first bias current by adding a boost current to a base bias current generated from a reference current;
a first amplification circuit configured to receive the first bias current and amplify a signal input through an input terminal of the first amplification unit to output a first amplified signal; and
a bias boosting circuit configured to generate the boost current based on a magnitude of a harmonic component in the amplified signal output from the first amplification circuit.

2. The power amplifying apparatus of claim 1, wherein the bias boosting circuit is configured to convert the harmonic component in the amplified signal output from the first amplification circuit into a direct current (DC) current, and generate the boost current based on a magnitude of the DC current.

3. The power amplifying apparatus of claim 1, wherein the bias boosting circuit comprises:
a harmonic extraction circuit configured to extract the harmonic component from the amplified signal output from the first amplification circuit;
a rectifier circuit configured to rectify the extracted harmonic component;
a low pass filter configured to generate a DC current by low-passing a signal rectified by the rectifier circuit and output the DC current; and
a boost circuit configured to boost the DC current output from the low pass filter and provide the boost current to the first bias circuit.

4. The power amplifying apparatus of claim 3, wherein the harmonic extraction circuit comprises an LC parallel resonance circuit that forms a parallel resonance point in a fundamental frequency component of the amplified signal output from the first amplification circuit to block a fundamental frequency component and pass harmonic components other than the fundamental frequency component to the rectifier circuit.

5. The power amplifying apparatus of claim 3, wherein the rectifier circuit comprises a diode-connected transistor configured to perform full-wave rectification of the harmonic component when a magnitude of the harmonic component extracted by the harmonic extraction circuit is equal to or greater than a magnitude of a turn-on voltage.

6. The power amplifying apparatus of claim 3, wherein the low pass filter comprises:
a resistor having one terminal connected to an output terminal of the rectifier circuit; and
a capacitor connected between the other terminal of the resistor and a ground.

7. The power amplifying apparatus of claim 3, wherein the boost circuit comprises a current boost transistor having a collector connected to a battery voltage, a base input with the DC current from the low pass filter, and an emitter boosting and outputting the DC current.

8. A power amplifying apparatus comprising:
a first bias circuit configured to generate a first bias current by adding a boost current to a base bias current generated from a reference current;
a first amplification circuit configured to receive the first bias current and amplify a signal input through an input terminal of the first amplification unit to output a first amplified signal;
a second bias circuit configured to generate a second bias current;
a second amplification circuit configured to receive the second bias current and amplify the first amplified signal received from the first amplification circuit; and
a bias boosting circuit configured to generate the boost current, based on a magnitude of a harmonic component in the amplified signal output from the first amplification circuit and provide the boost current to the first bias circuit.

9. The power amplifying apparatus of claim 8, wherein the bias boosting circuit is configured to convert the harmonic component in the amplified signal output from the first amplification circuit into a direct current (DC) current, and generate the boost current, based on a magnitude of the DC current.

10. The power amplifying apparatus of claim 8, wherein the bias boosting circuit comprises:
a harmonic extraction circuit configured to extract the harmonic component from the amplified signal output from the first amplification circuit;
a rectifier circuit configured to rectify the extracted harmonic component;
a low pass filter configured to generate a DC current by low-passing a signal rectified by the rectifier circuit; and a boost circuit configured to boost the DC current output from the low pass filter and provide the boost current to the first bias circuit.

11. The power amplifying apparatus of claim 10, wherein the harmonic extraction circuit comprises an LC parallel resonance circuit that forms a parallel resonance point in a fundamental frequency component of the amplified signal output from the first amplification circuit to block a fundamental frequency component and pass harmonic components other than the fundamental frequency component to the rectifier circuit.

12. The power amplifying apparatus of claim 10, wherein the rectifier circuit comprises a diode-connected transistor configured to perform full-wave rectification of the harmonic component when a magnitude of the harmonic component extracted by the harmonic extraction circuit is equal to or greater than a turn-on voltage.

13. The power amplifying apparatus of claim 10, wherein the low pass filter comprises:
 a resistor having one terminal connected to an output terminal of the rectifier circuit; and
 a capacitor connected between the other terminal of the resistor and a ground.

14. The power amplifying apparatus of claim 10, wherein the boost circuit comprises a current boost transistor having a collector connected to a battery voltage, a base input with a DC current from the low pass filter, and an emitter boosting and outputting the DC current.

15. A power amplifying apparatus comprising:
 a bias circuit configured to generate a first bias current by adding a boost current to a base bias current;
 an amplification circuit configured to receive the first bias current, amplify an input signal, and output an amplified signal;
 a bias boosting circuit comprising
  a harmonic extraction circuit configured to extract a harmonic component from the outputted amplified signal;
  a rectifier circuit configured to rectify the extracted harmonic component;
  a low pass filter configured to generate a direct current (DC) current by low-passing the rectified signal; and
  a boost circuit configured to generate the boost current based on a magnitude of the DC current and provide the generated boost signal to the first bias circuit.

16. The power amplifying apparatus of claim 15, wherein the base bias current is generated from a reference current.

17. The power amplifying apparatus of claim 15, wherein the rectifier circuit comprises a diode-connected transistor configured to perform full-wave rectification of the harmonic component when a magnitude of the harmonic component extracted by the harmonic extraction circuit is equal to or greater than a magnitude of a turn-on voltage.

18. The power amplifying apparatus of claim 15, wherein the boost circuit comprises a current boost transistor having a collector connected to a battery voltage, a base input with a DC current from the low pass filter, and an emitter boosting and outputting the DC current.

* * * * *